United States Patent [19]
Yabe et al.

[11] Patent Number: 5,879,840
[45] Date of Patent: Mar. 9, 1999

[54] FILM-FORMING METHOD FOR X-RAY MASK

[75] Inventors: Hideki Yabe; Kaeko Kitamura; Masao Kouhashi; Masamitsu Okamura; Kei Sasaki, all of Tokyo, Japan

[73] Assignee: Mitsubishi Denki Kabushiki Kaisha, Tokyo, Japan

[21] Appl. No.: 904,185

[22] Filed: Aug. 1, 1997

[30] Foreign Application Priority Data

Jan. 30, 1997 [JP] Japan .................................. 9-016856

[51] Int. Cl.$^6$ ....................................................... G03F 9/00
[52] U.S. Cl. ................................................ 430/5; 378/35
[58] Field of Search .............................. 430/5, 322, 324; 378/34, 35

[56] References Cited

U.S. PATENT DOCUMENTS

| | | | |
|---|---|---|---|
| 4,855,197 | 8/1989 | Zapka et al. ................................. | 430/5 |
| 5,677,090 | 10/1997 | Marumoto et al. ........................... | 430/5 |

FOREIGN PATENT DOCUMENTS 7-135157 A   5/1995   Japan .

OTHER PUBLICATIONS

"Total evaluation of W–Ti absorber for X–ray mask", Kenji Marumoto et al., Electro–Beam, X–Ray, and Ion–Beam Submicrometer Lithographies for Manufacturing IV, vol. 2194, pp. 221–230 (1994).

"A strategy for Highly Accurate X–ray masks", Kenji Marumoto et al., Digest of papers XEL'95, p. M6–2–1.

*Primary Examiner*—S. Rosasco
*Attorney, Agent, or Firm*—Sughrue, Mion, Zinn, MacPeak & Seas PLLC

[57] ABSTRACT

A film-forming method and an apparatus for a X-ray mask and a film-forming apparatus which are able to diminish stress unevenness in the X-ray mask to zero when a X-ray absorber is formed on a mask substrate by sputtering a target 3 during rotation of the mask substrate. Firstly, a dummy mask substrate is prepared instead of a mask substrate. A dummy X-ray absorber 6 is formed on this dummy X-ray substrate 5 within a sputtering range. Secondly, a stress distribution is measured at every position along a straight line passing through a center of the dummy X-ray absorber 6 and then a desirable stress distribution range X is selected at such a location so as to have a good linear characteristic in a portion of a compressive stress curve which decreases toward an outer periphery of the dummy X-ray absorber 6 in the stress distribution. A center of the desirable stress distribution range X is selected as a rotation center, the mask substrate is placed within the desirable stress distribution range X, and the X-ray absorber is formed by this film-forming technology.

26 Claims, 18 Drawing Sheets

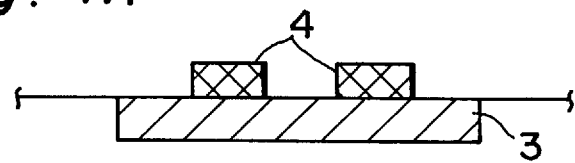
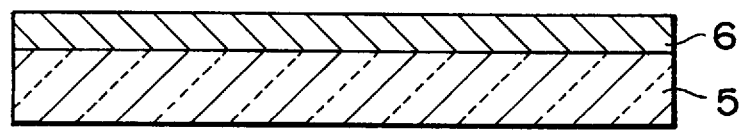
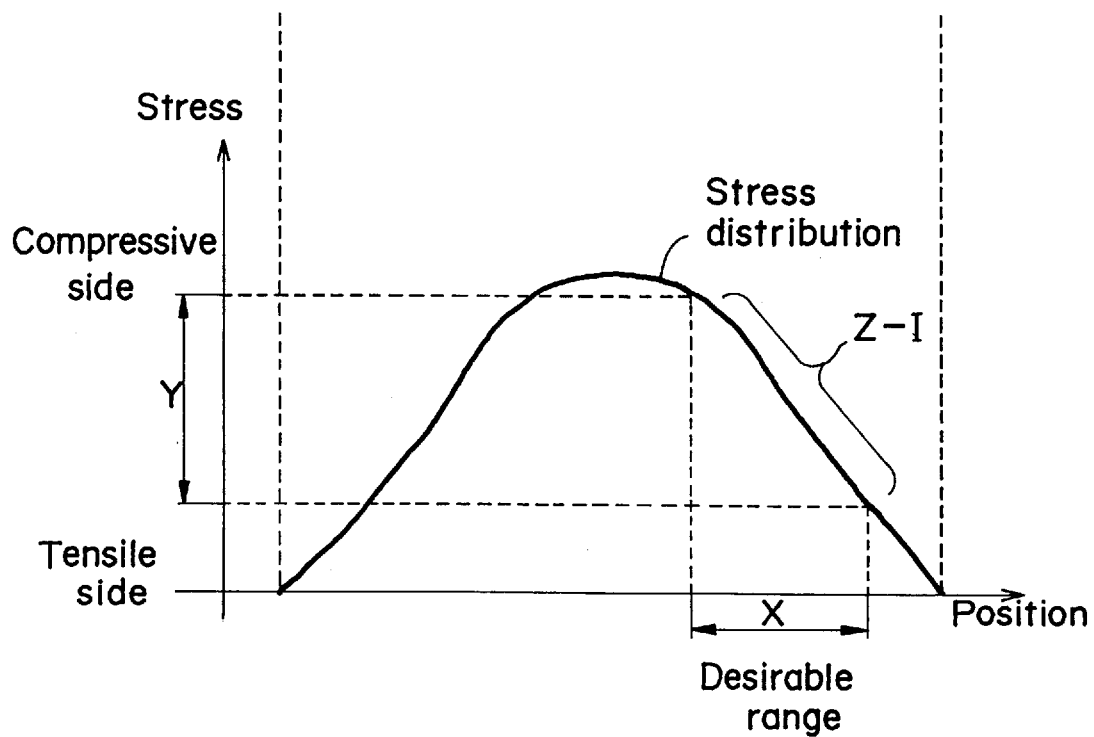

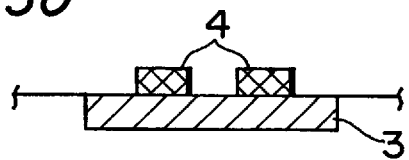
Fig. 30
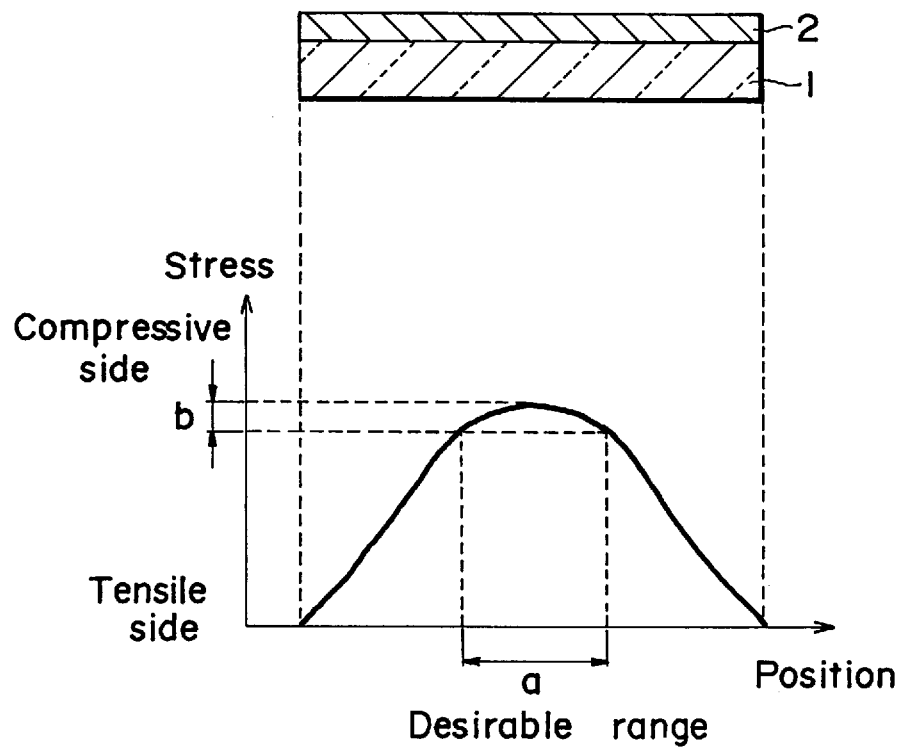
Fig. 31
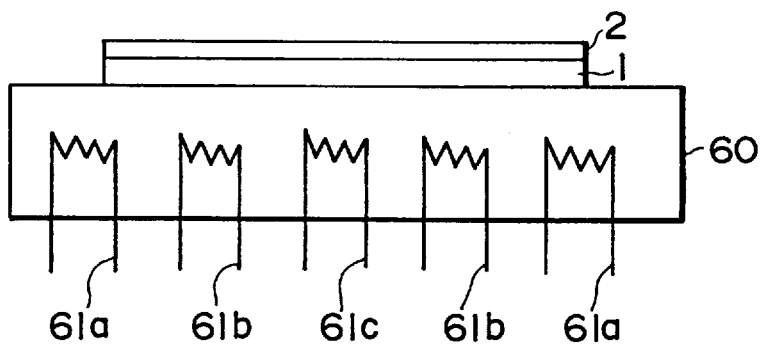

FILM-FORMING METHOD FOR X-RAY MASK

BACKGROUND OF THE INVENTION

(1) Field of the Invention

The present invention relates to a film-forming method for an X-ray mask and an apparatus for carrying out the film-forming method in which a film-forming can be accomplished such that a stress in an X-ray absorber of an X-ray mask for use in X-ray lithography is decreased everywhere to zero or to a negligible degree.

(2) Description of the Related Art

FIG. 30 is a sectional view showing a construction of a conventional film-forming apparatus for a X-ray mask with a stress distribution attained thereby. In FIG. 30, a X-ray absorber 2 is formed on a mask substrate 1. A target 3 is attached to a front surface of a magnet 4 for stabilizing an electric discharge and arranged opposite to the mask substrate 1.

Conventionally, as shown in FIG. 30, the X-ray absorber 2 is formed as a film on the mask substrate 1 by means of sputtering of the target 3. Using this method, a stress distribution in the X-ray absorber 2 will have a compressive stress which is high at a mid portion and reduced toward opposite ends, because the intensity of plasma gets stronger toward the mid portion of the target 3.

In the conventional stress distribution, a desirable stress distributing range is defined by a range represented by "a" in which a stress variation is included within a position range of "b" and which is located at the mid portion having less stress variation. Thus the X-ray absorber 2 is formed with a film formed only in the "a" range. Therefore, there is a problem that a film-forming range is limited due to the increase in an ineffective area and corresponding low productivity.

For solving such a problem, in the Japanese Patent Application No. 8-154322, we have already proposed a method for having a uniform a stress distribution in the X-ray absorber by means of annealing. One example of this method is illustrated in FIG. 31. First, a hot-plate 60 having a plurality of heaters 61a, 61b, 61c embedded therein is provided for controlling a temperature distribution of its working surface. FIG. 32A shows a measured stress distribution in the X-ray absorber 2. Annealing in an X-ray absorber 2 distributes the stress at the rate of about 1 MPa per 1° C. toward a tensile stress side, so that the annealing is carried out according to a temperature distribution on the hot-plate 60 as shown in FIG. 32B based on calculation of the stress distribution where all of the stress become zero.

In such an annealing method, even if the X-ray absorber 2 is formed in a range wider than the "a" range shown in FIG. 30, when the temperature distribution in the hot-plate 60 is adequately set, it becomes possible to eliminate the stress unevenness and to make the stress zero. Therefore, this annealing method provides such a superior feature that the stress and its unevenness can be made zero even if a film-forming apparatus or a film-forming method would be not optimized.

However, there are still remains the following problems;

1) Such a forming method is not suitable for mass production because a stress measurement, a temperature setting and so on are required for every absorber 2 at the time of annealing.

2) When the mask substrate 1 to be formed has an increased thickness, it becomes difficult to provide an adequate temperature distribution to make the stress unevenness zero because the mask substrate 1 itself has good thermal conduction which make it difficult to have proper temperature distribution.

SUMMARY OF THE INVENTION

The present invention is directed to solving the above-described problems and has as a first object to provide a film-forming method for an X-ray mask and a film-forming apparatus for the X-ray mask which are suitable for mass production of an X-ray absorber provided with a stress distribution of zero or a negligible level over its entire distribution.

Further, the present invention has as a second object to provide a film-forming method for a X-ray mask and a film-forming apparatus for the X-ray mask which provides a stress distribution of zero or a negligible level over its entire length even if the mask substrate has an increased thickness.

As noted above, according to a first aspect of the present invention, there can be provided a film-forming method for a X-ray absorber adapted to form a X-ray absorber on a mask substrate by sputtering a target during the rotation of the mask substrate as follows: first a dummy mask substrate is prepared instead of a mask substrate, a dummy X-ray absorber is then formed as a film on the dummy mask substrate within a sputtering range, a stress distribution is then measured at every position along an optional straight line of the dummy X-ray absorber, a location having a good linear characteristic along a portion of the stress distribution in which a stress varies toward an outer periphery of the dummy X-ray absorber is then selected as the desirable stress distribution range, and, finally, the mask substrate is placed within the desirable stress distribution range with its center of revolution center coinciding with the center of the desirable stress distribution range to produce the X-ray absorber by the film-forming technology. Accordingly, it becomes possible to provide the film-forming method for the X-ray mask which is capable of averaging stress values.

According to a second aspect of the present invention, there can be provided a film-forming method for a X-ray absorber adapted to form a X-ray absorber on a mask substrate by sputtering a target during the rotation and the revolution of the mask substrate as follows: first a dummy mask substrate is prepared instead of a mask substrate, a dummy X-ray absorber is then formed as a film on the dummy mask substrate within a sputtering range, a stress distribution is then measured at every position along an optional straight line of the dummy X-ray absorber, a location having a good linear characteristic along a portion of the stress distribution in which a stress varies toward an outer periphery of the dummy X-ray absorber is then selected as the desirable stress distribution range, finally, the mask substrate is revolved so that its rotational center passes through a center of the desirable stress distribution range and the mask substrate is placed so as to pass through the desirable stress distribution range to produce the X-ray absorber by the film-forming technology. It, therefore, becomes possible to provide the film-forming method for the X-ray mask which is capable of averaging stress values and has good productivity.

According to a third aspect of the present invention, there can be provided a film-forming method for a X-ray absorber adapted to form a X-ray absorber on a mask substrate by sputtering a target during the rotation of the mask substrate as follows: first a dummy mask substrate is prepared instead of a mask substrate, a dummy X-ray absorber is then formed as a film on the dummy mask substrate within a sputtering range, a stress distribution is then measured at every position along an optional straight line of the dummy X-ray absorber, a location having a good linear characteristic of a portion of the stress distribution in which a stress varies toward an outer periphery of the dummy X-ray absorber is then selected as the desirable stress distribution range, finally, the mask substrate is made smaller than the desirable stress distribution range and a X-ray absorber is formed by the film-forming technology while revolving and rotating the mask substrate within the desirable stress distribution range. It becomes possible, therefore, to provide the film-forming method for the X-ray mask which is capable of averaging stress values.

In an preferred embodiment of the third aspect of the present invention, an orbit of a rotating center of the mask substrate is deviated from a circular orbit having a center coincident with the revolving center of the mask substrate. It becomes possible, therefore, to provide the film-forming method for the X-ray mask which is capable of further averaging stress values.

According to a fourth aspect of the present invention, there can be provided a film-forming method for a X-ray absorber adapted to form a X-ray absorber on a mask substrate by sputtering a target during the rotation and the revolution of the mask substrate as follows: first a dummy mask substrate is prepared instead of a mask substrate, then a dummy X-ray absorber is formed as a film on the dummy mask substrate within a sputtering range, then a stress distribution is measured at every position along an optional straight line of the dummy X-ray absorber, then a location having a good linear characteristic of a portion of the stress distribution in which a stress varies toward an outer periphery of the dummy X-ray absorber is selected as the desirable stress distribution range, and finally, the mask substrate which is smaller than the desirable stress distribution range is revolved so that a passing range of the mask substrate is within the desirable stress distribution range and a orbit of a rotating center of the mask substrate is deviated from a circular orbit having its center coincident with a revolving center of the mask substrate to produce the X-ray absorber by the film-forming technology. Therefore, it becomes possible to provide the film-forming method for the X-ray mask which is capable of averaging stress values and has good productivity.

In another embodiment of the present invention, the ratio of an off-centered period of the mask substrate to a revolving period of the mask substrate is defined by a non-integer. Therefore, it becomes possible to provide the film-forming method for the X-ray mask which is capable of averaging stress values surely.

According to a fifth aspect of the present invention, a surface of the target and a surface of the dummy mask substrate are set to a positional relationship inclined at a predetermined angle to form a dummy X-ray absorber on the dummy mask substrate, and the mask substrate and the target are set to the positional relationship to form a X-ray absorber. Therefore, it becomes possible to provide the film-forming method for the X-ray mask which is capable of forming the X-ray absorber over a wider range.

In the present invention, the dummy X-ray absorber may be formed while the dummy mask substrate is rotated about a center of a sputtering range, because it becomes possible to provide the film-forming method for the X-ray mask which is capable of averaging stress values accurately.

Further, the selected straight line passing through the dummy X-ray absorber may be set to a straight line passing through the center of the dummy X-ray absorber to provide the film-forming method for the X-ray mask which is capable of averaging stress values accurately. In this case, if a stress value changes toward an outer periphery of the dummy X-ray absorber and a stress distribution is symmetrical with respect to a center of the straight line, so that there can be selected two desirable stress distribution ranges at symmetrical locations with respect to the center of the desirable stress distribution range, the X-ray absorber should be formed while the mask substrate is rotated about the center of the desirable stress distribution range and revolved about the center of the straight line, so that it becomes possible to provide the film-forming method for the X-ray mask which has a good productivity.

The stress distribution may be determined by measuring film thickness values at every position of an optional straight line of a dummy X-ray absorber and multiplying the film thickness values by the stress value at every position, because it then becomes possible to provide the film-forming method for the X-ray mask which is capable of averaging stress values accurately.

In a preferred embodiment according to the present invention, stress deviations in the stress distribution with respect to a linear characteristic defined by a line joining a stress value at one end of the desirable stress distribution range and a stress value at the other end thereof may be set to 50 MPa or less within the desirable stress distribution range, because it is possible to provide the film-forming method for the X-ray mask which is capable of averaging stress values accurately. Especially, in the case that the desirable stress distribution range has an intersecting point between the stress distribution curve and a linear characteristic obtained by a line joining a stress value at one end of the desirable stress distribution range and a stress value at the other end thereof, the stress deviations in the stress distribution with respect to the linear characteristic may be set to 100 MPa or less.

On carrying out a method according to the present invention, there may be used such a mechanism as being capable of changing distance relationship including a horizontal distance and a vertical distance between the center of the mask substrate and the center of the target in order to change a relative positional relationship between the mask substrate and the target.

In another embodiment, there may be used such a mechanism as being capable of changing a distance between the rotating center of the mask substrate and the revolving center thereof in order to change the distance between the rotating and the revolving centers of the mask substrate. Such a mechanism as being capable of changing a distance between a rotating and a revolving centers of the mask substrate may be constructed as follows:

1) at least one third gear is interposed between a first gear having its axis coincident with the revolving center of the mask substrate and a second gear having its axis coincident with the rotating center thereof so that a distance between a center of the first gear and a center of the second gear can be changed through the third gear.

2) a first gear having its axis coincident with the revolving center of the mask substrate, a second gear having its axis coincident with the rotating center thereof, a third gear meshing with the first gear and a belt for connecting the third gear and the second gear are arranged in a manner that a distance between a center of the first gear and a center of the second gear can be changed through the third gear and the belt.

3) a first gear having its axis coincident with the revolving center of the mask substrate and a second gear having its axis coincident with the rotating center thereof are connected by at least one belt in a manner that a distance between a center of the first gear and a center of the second gear can be changed by extending and contracting the belt.

In an embodiment for changing inclinations of the mask substrate and the target, there may be used such a mechanism as being capable of setting the surface of the mask substrate and the surface of the target in a positional relationship inclined at a predetermined angle.

In an embodiment for deviating an orbit of the rotating center of the mask substrate from a circular orbit having its center coincident with the revolving center thereof, at least one of the first gear having its axis coincident with the revolving center of the mask substrate and the second gear having its axis coincident with the rotating center of the mask substrate may be a non-circular gear or a gear with an eccentric axis. In this case, a ratio of the number of the first gear teeth to the number of the second gear teeth may be defined by a non-integer so that a ratio of an off-centered period of the mask substrate to a revolving period thereof becomes a non-integer.

BRIEF DESCRIPTION OF THE DRAWINGS

FIG. 1A is a sectional view showing a film-forming method for a X-ray mask according to a first embodiment of the present invention and FIG. 1B is a graph showing a stress distribution.

FIG. 30 is a view showing a conventional film-forming method for a X-ray mask.

FIG. 31 is a view showing a construction of a conventional film-forming apparatus for the X-ray mask.

DESCRIPTION OF THE PREFERRED EMBODIMENTS

Embodiments of the present invention will be explained with reference to the attached drawings hereinafter.

<First Embodiment>

FIG. 1A is a view showing a film-forming method for a X-ray mask according to a first embodiment of the present invention. In FIG. 1A, the same portions as those in FIG. 30 are designated by the same numbers and explanations thereof are omitted. A dummy X-ray absorber 6 is formed on a dummy mask substrate 5. First, as shown in FIG. 1A, a dummy mask substrate 5 is arranged within a sputtering range and rotated about a center thereof. Then, a dummy X-ray absorber 6 is formed as a film on the dummy mask substrate 5 located in the sputtering range by utilizing the target 3. Next, the stress is measured at each of predetermined positions along a straight line passing through a center of this dummy X-ray absorber 6 to get a stress distribution. The film stress distribution in the dummy X-ray absorber 6 can be readily obtained by measuring a camber of the dummy X-ray absorber 6, carrying out a second differentiation of this camber and multiplying a result thereof by a desirable coefficient. FIG. 1B shows one example of the stress distribution corresponding to the respective positions of the dummy X-ray absorber 6.

Incidentally, at this time, the rotation of the dummy mask substrate 5 is carried out for measuring the stress values accurately. However, the dummy X-ray absorber 6 may be formed under a non-rotating condition.

Next, as the stress distribution shown in FIG. 1B has a good linearity zone in a portion of a compressive stress toward an outer periphery of the dummy X-ray absorber 6, a desirable stress distribution range X is set to the good linearity zone. Then, a center of this desirable stress distribution range X is selected as a rotational center of the mask substrate and the mask substrate is placed within the desirable stress distribution range X to produce a X-ray substrate by a film-forming method.

Figure 2:
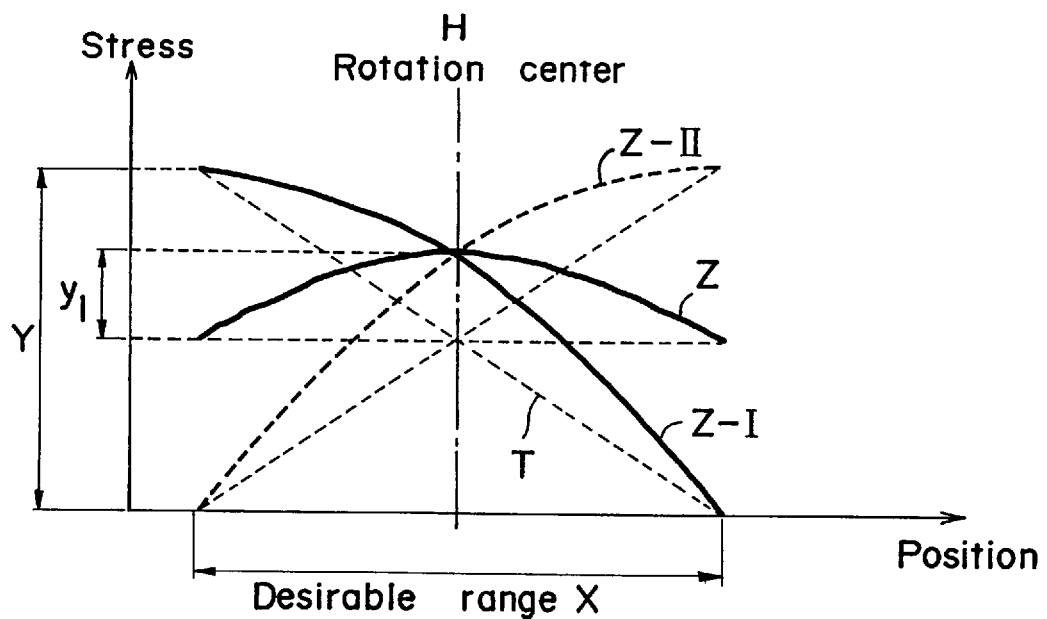
FIG. 2 is a graph showing a first stress distribution of the X-ray mask according to the first embodiment thereof.

The actual stress distribution in the X-ray absorber formed as described alone will be explained hereinafter. FIG. 2 is a partial enlarged view showing the desirable stress distribution range X and a stress distribution Z-I in FIG. 1B. As shown in FIG. 2, when the stress distribution Z-I is rotated about a center axis H of the desirable stress distribution range X, the stress distribution Z-I performs a symmetrical rotation with respect to the center axis H, so that the X-ray absorber after rotation has a means stress distribution Z, which is a mean value between a stress distribution Z-II during the rotation and the stress distribution Z-I.

This method makes the maximum stress differential Y decrease to a smaller stress differential y1. Accordingly, compared with the conventional case where the X-ray absorber is formed within the range "a" having a stress differential "b" as shown in FIG. 30, the X-ray absorber can be formed within a wider range, namely the desirable stress distribution range X. Further more the stress differential Y can be readily diminished to y1 by means of rotation.

As shown in FIG. 2, a linear characteristic T is defined by a straight line joining a stress value at one end of the desirable stress distribution range X and a stress value at the other end thereof. It can be understood that a center position of this desirable stress distribution range X has the maximum value of a deviation between the linear characteristic T and the stress distribution Z and thus a value of the stress differential at this position becomes the same value as the stress differential y1 in the mean stress distribution Z after rotation.

Herein, an acceptable range of the stress differential y1 will be explained. Conventionally, 100% etching in the formation of the X-ray mask causes a strain of about 15 nm in the pattern of the X-ray mask at 10 MPa of the stress differential in the X-ray mask. Practically, since the etching area of the X-ray mask is about 40%, it is assumed that a deviation becomes 6 nm corresponding to about 40% of that maximum value (15 nm). Generally, since the deviation is allowed to have only about 30 nm, the acceptable maximum value of the stress differential y1 becomes 50 MPa (=10 MPa×30 nm/6 nm). Therefore, as mentioned above, when the X-ray mask is formed at such a location as having the good linearity in which the stress differential y1 becomes 50 MPa or less, it is possible to secure an accuracy of the X-ray mask satisfactorily.

Figure 3:
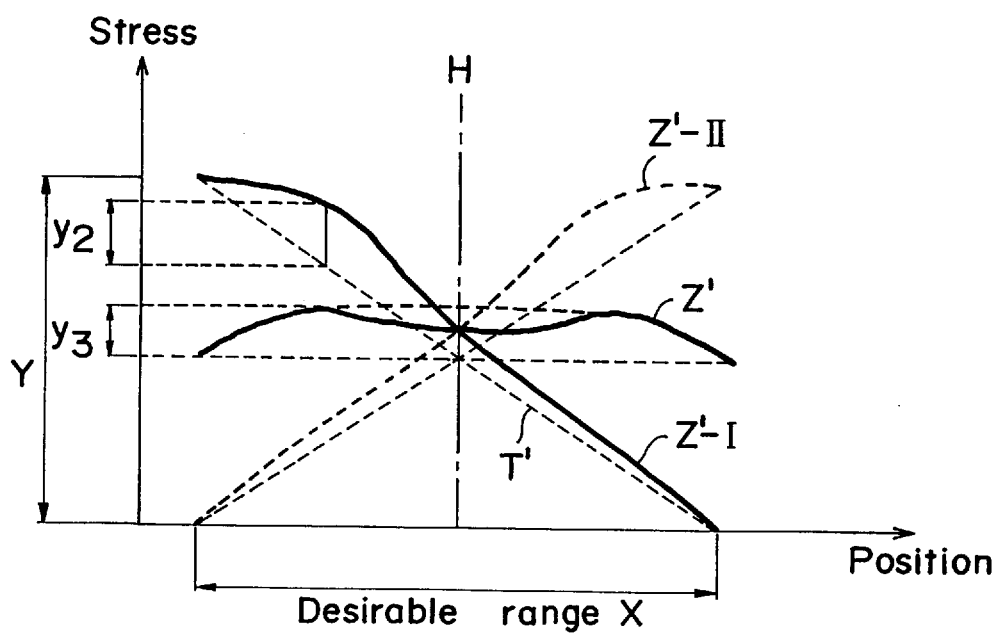
FIG. 3 is a graph showing a second stress distribution of the X-ray mask according to the first embodiment thereof.

Though FIG. 2 exemplifies that there is the maximum value y1 in the tress differential between the stress distribution Z-I and the linear characteristic T at the center of the desirable stress distribution range X, there is also such a case as to have the maximum stress differential y2 at a position deviated from the center of the desirable stress distribution range X, for example as shown in FIG. 3. In this case, when the X-ray mask is formed as described above, a stress differential y3 smaller than the maximum stress differential y2 can be obtained as the stress differential in the stress distribution during rotation. Accordingly, when a linear characteristic T' is defined by a straight line joining between a stress value at one end of the desirable stress distribution range X and a stress value at the other end thereof to set the stress differential y2 as the maximum value of the deviation to 50 MPa or less, it becomes possible to diminish the stress unevenness in the X-ray mask less than that exemplified in FIG. 2 because the stress differential y3 is smaller than this maximum stress differential y2.

Figure 4:
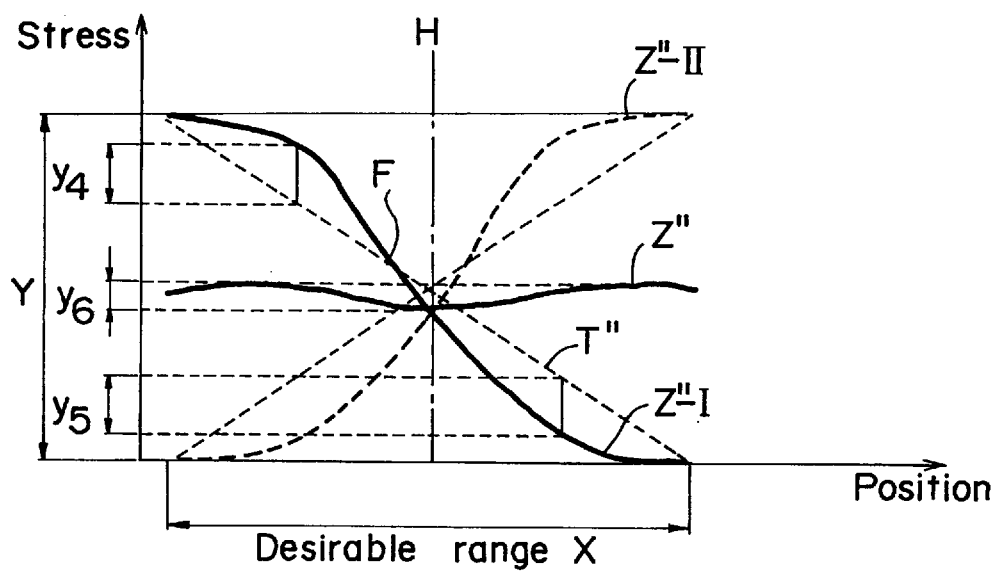
FIG. 4 is a graph showing a third stress distribution of the X-ray mask according to the first embodiment thereof.

As shown in FIG. 4, when a linear characteristic T" is defined by a straight line joining between a stress value at one end of the desirable stress distribution range X and a stress value at the other end thereof and having an intersecting point F between this linear characteristic T" and a stress distribution Z", provided that the maximum stress differential y4 or y5 of a deviation of a stress distribution Z"-I from the linear characteristic T" is equal to 100 MPa or less, it is possible to secure the accuracy of the X-ray mask similarly to the above-mentioned one.

This is based on the following reason. That is, in the case with the intersecting point F, even if the deviation from the linear characteristic T" is larger than that in the above-mentioned case, the maximum stress differentials y4, y5 take such deviations as to have reversed polarities to each other with respect to the linear characteristic T", so that the and the stress differential y6 in the stress distribution Z" after rotation is diminished to about half in comparison with the case where the stress value curve does not intersect the straight line T.

Incidentally, the above-described stress distribution was exemplified by using the stress distribution along the straight line passing through the center of the dummy X-ray absorber 6 so as to make the desirable stress distribution range X defined wider as described above. But, it is not necessarily limited to this.

The above-described stress distribution may be obtained by plotting stress values at the respective positions along the straight line of the dummy X-ray absorber 6. Further, in order to obtain the stress distribution more exactly, it is better to measure the stress values and film thickness values at every positions along the straight line of the dummy X-ray absorber 6 and calculate plot values by multiplying each of these film thickness values by each of the stress values respectively. This is the reason why the stress is proportional to the film thickness.

Figure 5:
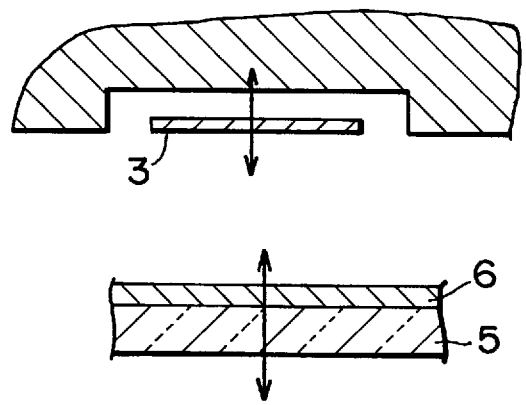
FIG. 5 is a schematic view showing a construction of a film-forming apparatus for the X-ray mask according to the present invention.

The above described stress distribution can be obtained by the following methods. For example as shown in FIG. 5, such a mechanism as to change a vertical distance between both centers of the target 3 and the dummy mask substrate 5 can be provided for changing the vertical distance. By using such a mechanism, the dummy X-ray absorber 6 is formed at each vertical distance and each of the stress distributions is measured. Thereupon, the location having the best linear characteristic can be selected and the X-ray absorber can be formed based on this vertical distance as described above.

Figure 6:
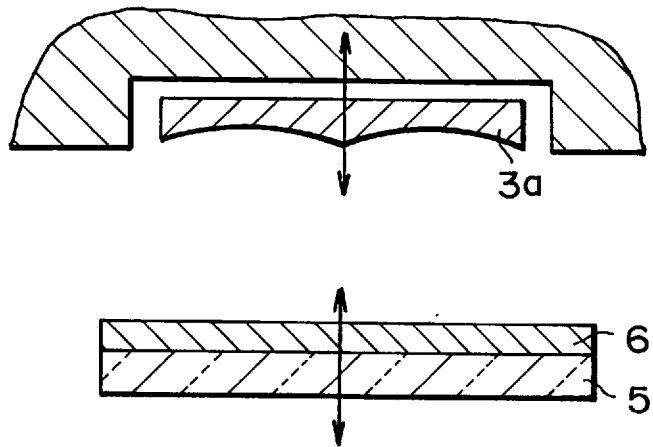
FIG. 6 is a schematic view showing the film-forming apparatus of FIG. 5 with a used target.

Further, the target becomes thinner unevenly as shown in FIG. 6 as the sputtering proceeds, so that the target 3a has an uneven thickness. In such a target 3a, the same stress distribution cannot be obtained under the positional relationship between the dummy mask substrate 5 and the target 3 determined by adopting an even thickness at the initial stage of the produced X-ray absorber as shown in FIG. 5. Therefore, formation of the X-ray absorber should be carried out as described above in a new positional relationship obtained by selecting the best linear characteristic after changing the vertical distance between the target 3a and the dummy mask substrate 5 again, forming the dummy X-ray absorber 6 at the respective positions and measuring the stress distribution.

Next, a method of producing the X-ray absorber within the desirable stress distribution range X will be explained hereinafter.

Figure 7:
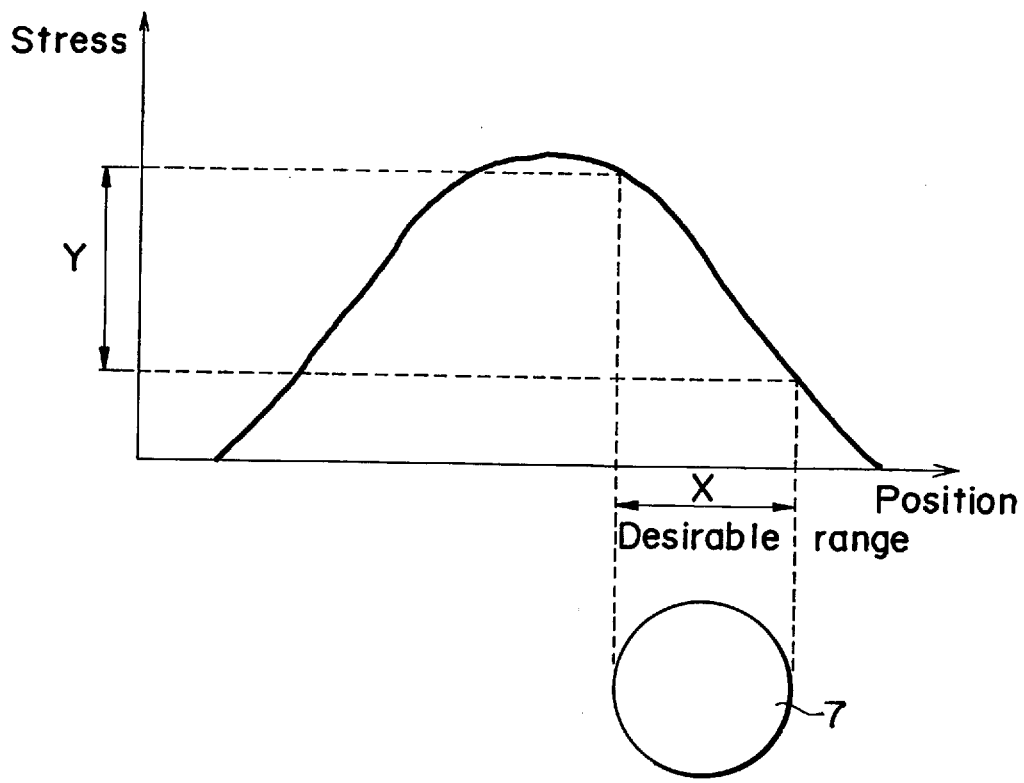
FIG. 7 is a view showing a first arranging position of the mask substrate according to the first embodiment thereof.
Figure 8:
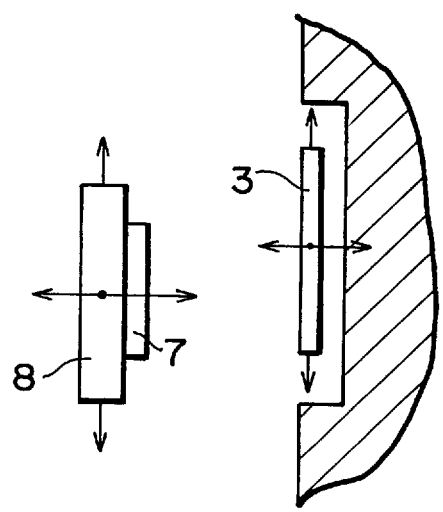
FIG. 8 is a view showing a second construction of the film-forming apparatus for the X-ray mask according to the first embodiment thereof.

As shown in FIG. 7, the mask substrate 7 having the same diametral dimension as that of the desirable stress distribution range X is placed within the desirable stress distribution range X. For accomplishing this placement, for example as shown in FIG. 8, it is enough to use a film-forming apparatus for the X-ray mask provided with a mechanism which is capable of changing a positional relationship (referred to as a relative positional relationship hereinafter) including a horizontal distance and a vertical distance between a center of a substrate holder 8 on which the mask substrate 7 is placed (namely, a center of the mask substrate 7) and a center of the target 3. The film-forming for the X-ray absorber is carried out by suitably setting the mask substrate 7 so as to take the positional relationship represented in FIG. 7. Incidentally, though the positional relationship between the target 3 and the mask substrate 7 according to the setting for the desirable stress distribution range X was explained based on the positional relationship represented in the FIG. 5 for convenience, the positional relationship between the target 3 and the mask substrate 7 for practically forming the X-ray mask is set as shown in FIG. 8. This is preferable for preventing the accumulating of foreign materials on the mask substrate 7 and the target 3.

Figure 9:
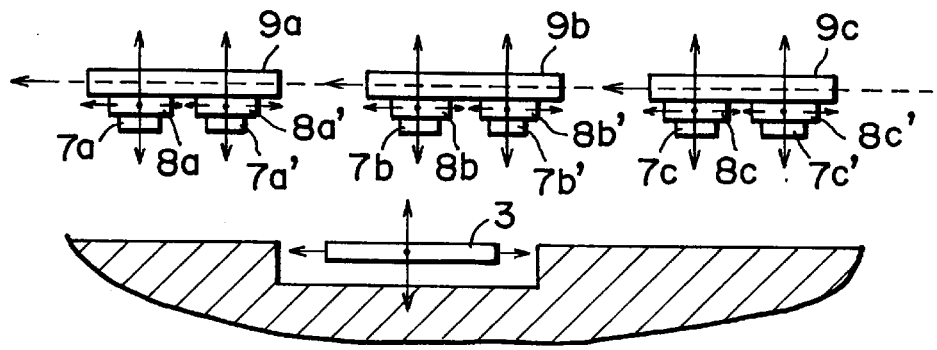
FIG. 9 is a view showing a third construction of the film-forming apparatus for the X-ray mask according to the first embodiment thereof.

As shown in FIG. 9, substrate holders 8a, 8a', 8b, 8b, 8c, 8c' to which the mask substrates 7a, 7a', 7b, 7b', 7c, 7c' are attached respectively are carried by a plurality of carriers 9a, 9b, 9c. The substrate holders 8a, 8a', 8b, 8b, 8c, 8c' carried by these plurality of carriers 9a, 9b, 9c are disposed so as to face the target 3. When the X-ray absorbers are formed sequentially, similarly to the case represented in FIG. 8, the film-forming apparatus for the X-ray mask having the mechanism capable of changing the relative positional relationship between the target 3 and the substrate holders 8a, 8a', 8b, 8b, 8c, 8c' can be employed, so that the mask substrates 7a, 7a', 7b, 7b, 7c, 7c' are set to the positional relationship shown in FIG. 7 to form the X-ray absorbers sequentially. Incidentally, the similar method in FIG. 8, can be employed practically in the case of FIG. 9 for preventing the accumulating of foreign materials on the mask substrates 7a, 7a', 7b, 7b, 7c, 7c'.

Figure 10:
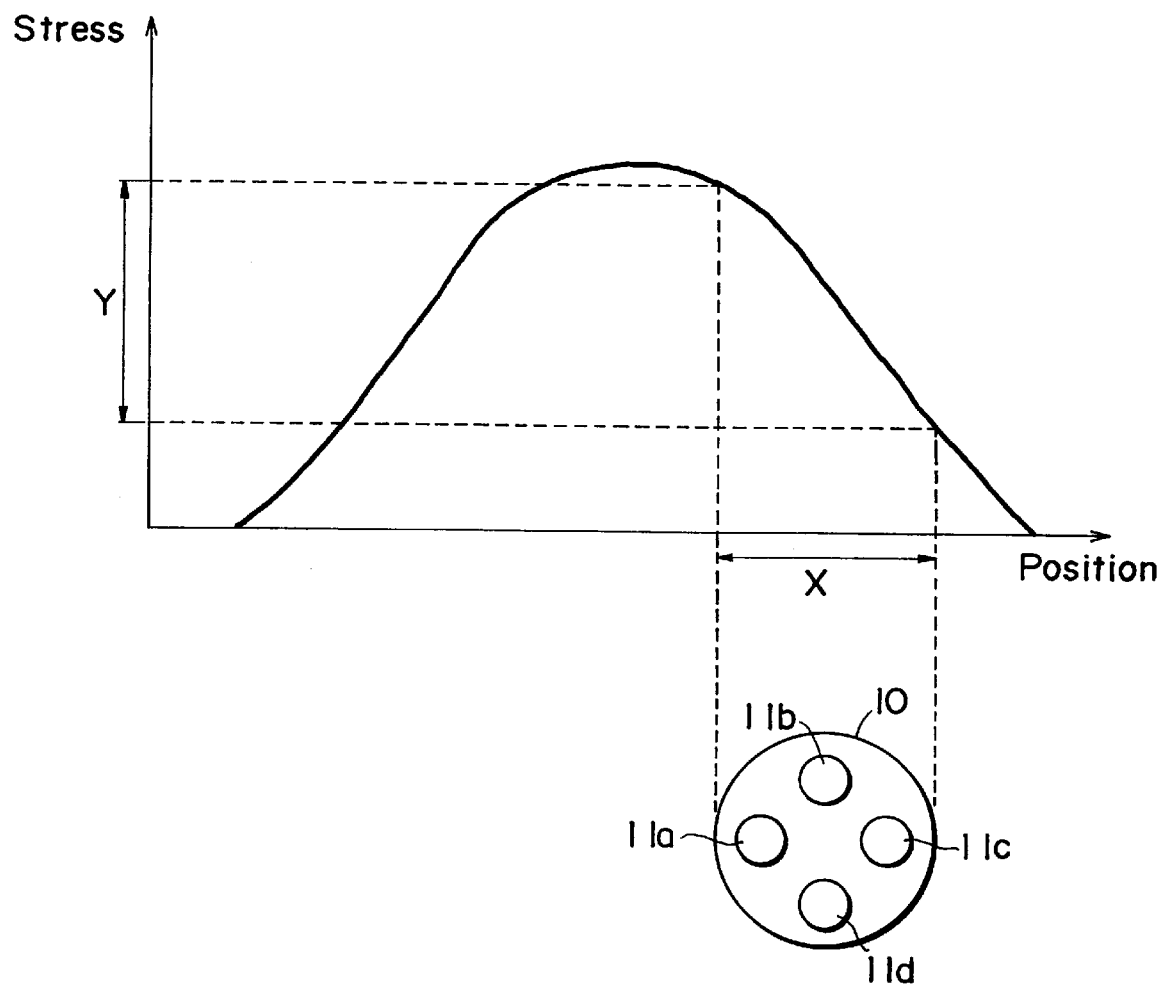
FIG. 10 is a view showing a third arranging position of the mask substrate according to the first embodiment thereof.
Figure 11:
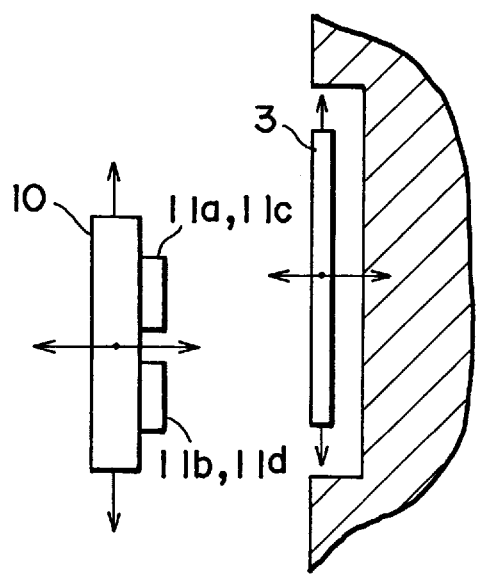
FIG. 11 is a view showing a fourth construction of the film-forming apparatus for the X-ray mask according to the first embodiment thereof.

Next, a mechanism for orbitally revolving the mask substrate will be explained. As shown in FIG. 10, a revolving pallet 10 is arranged such that its center coincides with the center of the desirable stress distribution range X, and mask substrates 11a, 11b, 11c, 11d are placed on the revolving pallet 10. In order to accomplish this arrangement, for example as shown in FIG. 11, one can use the film-forming apparatus for the X-ray mask provided with a mechanism capable of changing the relative positional relationship between the target 3 and the revolving pallet 10 on which the mask substrates 11a, 11b, 11c, 11d are placed. Thereupon, after the mask substrates 11a, 11b, 11c, 11d are placed in the positional relationship shown in FIG. 10, film-forming of the X-ray absorber is carried out.

Next, a mechanism for rotating and orbitally revolving the mask substrates will be explained. In this case, there are two desirable stress distribution ranges X1 and X2 which are symmetrical with respect to the center line of the stress distribution curve, which has portions of the compressive stresses decreasing toward the outer peripheries of the dummy X-ray absorber.

Figure 12:
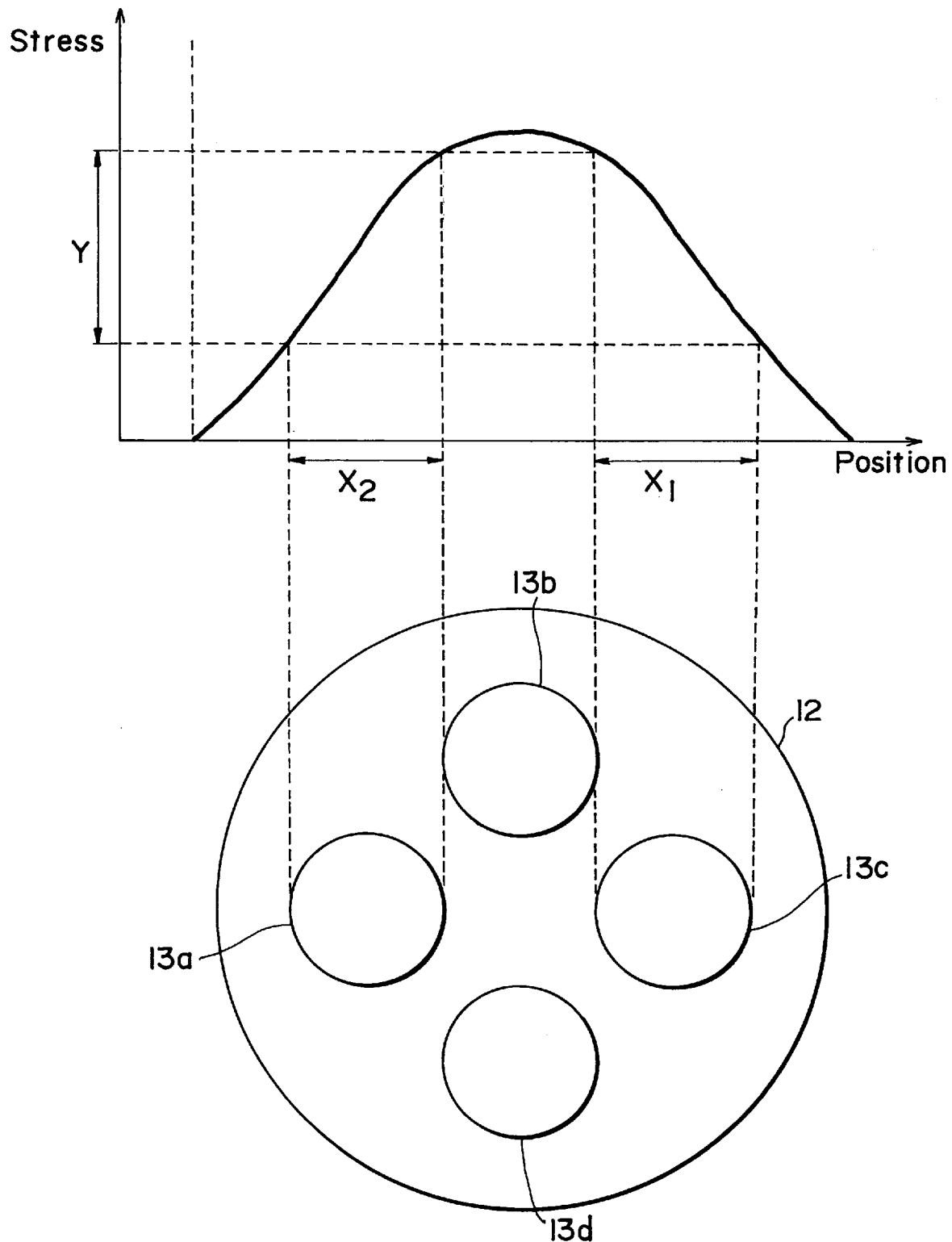
FIG. 12 is a view showing a fourth arranging position of the mask substrate according to the first embodiment thereof.
Figure 13:
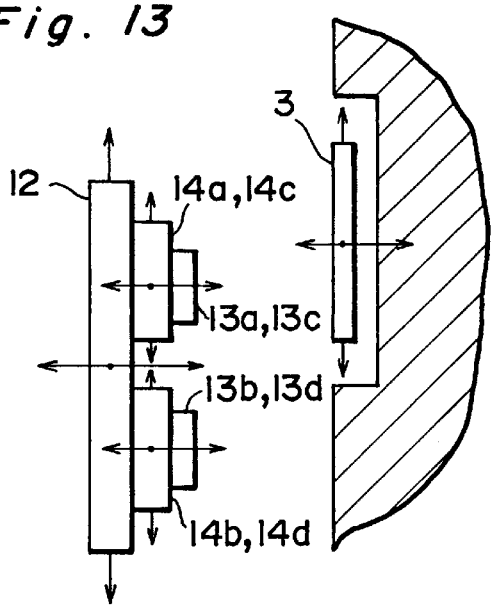
FIG. 13 is a view showing a fifth construction of the film-forming apparatus for the X-ray mask according to the first embodiment thereof.

First, as shown in FIG. 12, the revolving pallet 12 is placed so that its center coincides with a center of a linearity range obtained by the measurement of the stress distribution, and then the respective mask substrates 13a, 13b, 13c, 13d are placed on the revolving pallet 12. In order to accomplish this arrangement, for example as shown in FIG. 13, rotating pallets 14a, 14b, 14c, 14d on which the respective mask substrates 13a, 13b, 13c, 13d are placed so as to rotate about their own axes are mounted to the revolving pallet 12.

Further, a film-forming apparatus for the X-ray mask provided with a mechanism for changing the positional relationship between the target 3 and the revolving pallet 12 with the rotating pallets 14a, 14b, 14c, 14d is used, and the mask substrates 13a, 13b, 13c, 13d are set to the positional relationship shown in FIG. 12 to produce the X-ray absorbers by means of the film-forming technology.

<Second Embodiment>

Figure 14:
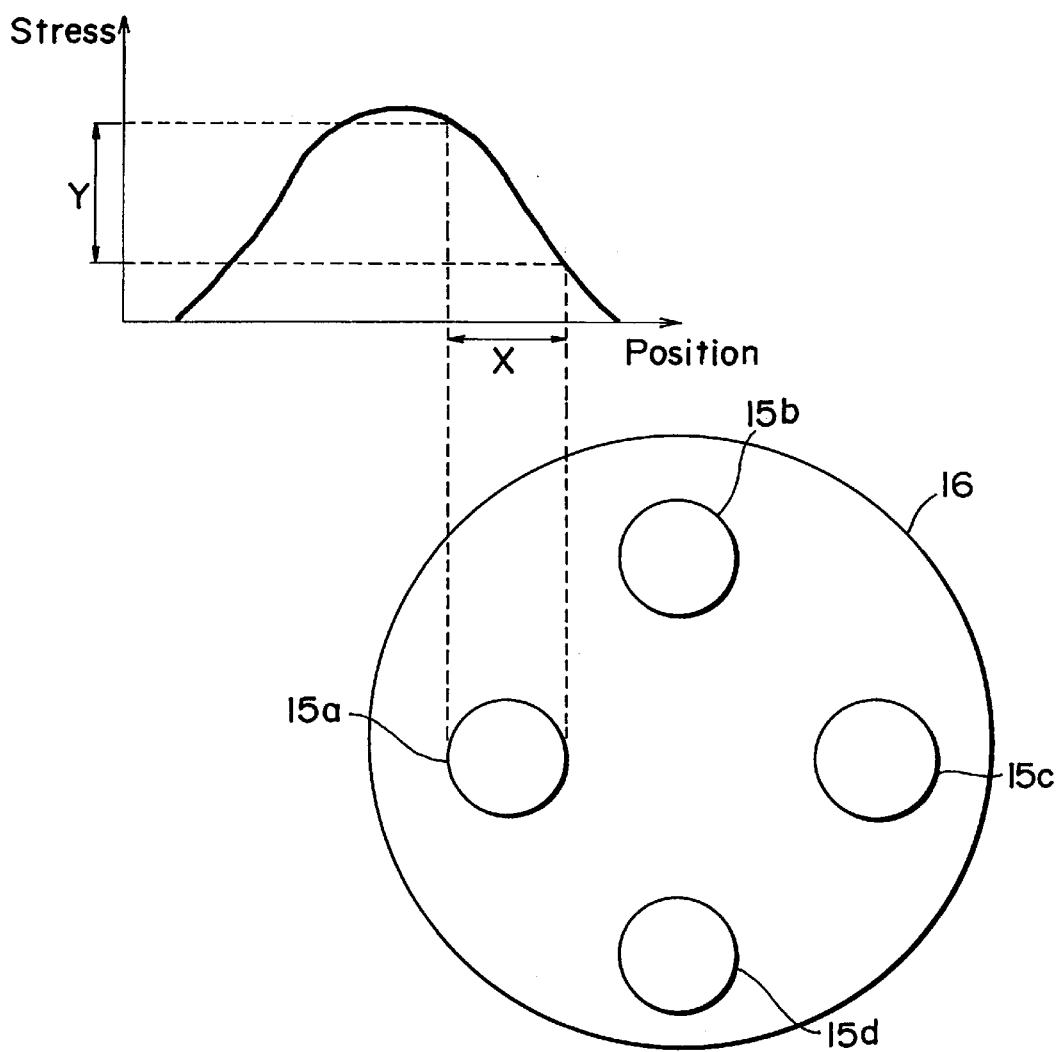
FIG. 14 is a view showing a first arranging position of the mask substrate according to a second embodiment of the present invention.

In the first embodiment, the mask substrates were rotated about the center of the desirable stress distribution range X, for example as shown in FIG. 14. In this embodiment, although the desirable stress distribution range X is also set similarly to the first embodiment, a revolving pallet 16 is arranged for revolving mask substrates 15a, 15b, 15c, 15d so that the rotation center of the mask substrate 15a, 15b, 15c, 15d can pass through the center of the desirable stress distribution range X.

The film-forming method employed in the second embodiment lowers the accuracy of the X-ray mask by a little compared with the first embodiment, since the mask substrates also pass through a small portion of a different range from the desirable stress distribution range X. But, more effective utilization of the desirable stress distribution range X can be obtained in this embodiment, resulting in a good productivity of the X-ray absorber.

Thereupon, of course, it is possible to use the film-forming apparatus for the X-ray mask represented in FIG. 13 in the first embodiment. In the orbitally revolving and rotating mechanism employed in the film-forming apparatus for the X-ray mask of FIG. 14, it becomes necessary to change a distance between the revolving center and the rotating center depending on the location of the desirable stress distribution range X. A way for changing the distance between the revolving center and the rotating center will be explained by several examples hereinafter.

Figure 15:
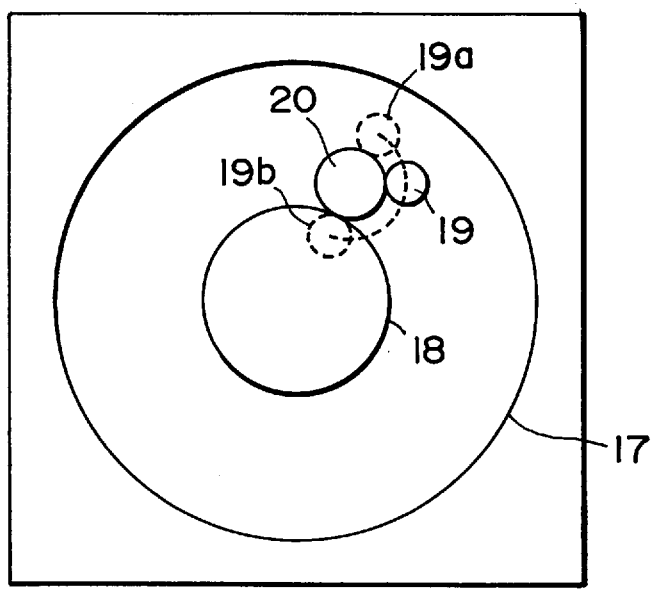
FIG. 15 is a view showing a first construction of the film-forming apparatus for the X-ray mask according to the second embodiment thereof.

First, as shown in FIG. 15, a third gear 20 is interposed between a first gear 18 having its axis coincident with the revolving center of an orbitally revolving pallet 17, namely of the mask substrate, and a second gear 19 having its axis coincident with the rotating center of the mask substrate. The position of the second gear 19 can be changed from the position indicated by 19a to the position indicated by 19b along the periphery of the third gear 20, so that a distance between the center of the first gear 18 and the center of the second gear 19 can be changed accordingly. Owing to this arrangement, the distance between the revolving center and the rotating center can be set for convenience.

Figure 16:
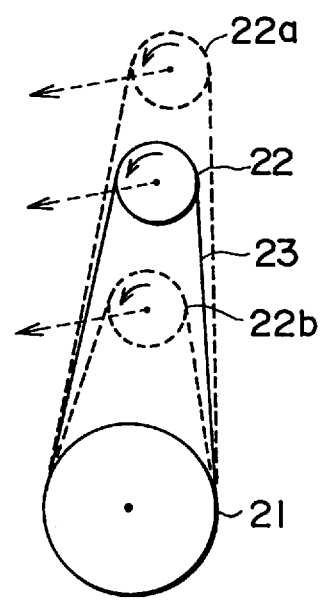
FIG. 16 is a view showing a second construction of the film-forming apparatus for the X-ray mask according to the second embodiment thereof.

Otherwise, as shown in FIG. 16, a first gear 21 having its axis coincident with the revolving center of the mask substrate and a second gear 22 having its axis coincident with the rotating center of the mask substrate are connected by a belt 23. The position of the second gear 22 can be changed from the position indicated by 22a to the position indicated by 22b by extending and contracting the belt 23, so that a distance between the center of the first gear 21 and the center of the second gear 22 can be changed accordingly. In this case, the changeable distance can be increased by the belt 23 in comparison with the case represented in FIG. 15.

Figure 17:
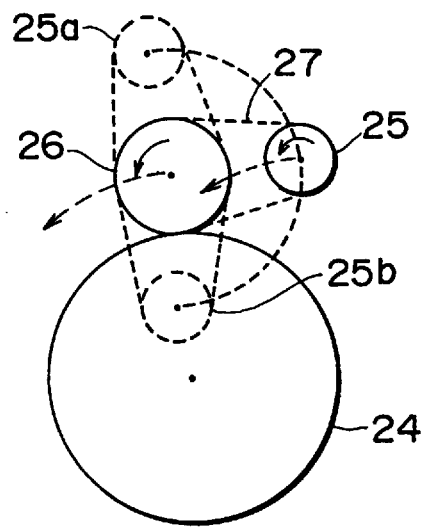
FIG. 17 is a view showing a third construction of the film-forming apparatus for the X-ray mask according to the second embodiment thereof.

Otherwise, as shown in FIG. 17, a first gear 24 having its axis coincident with the revolving center of the mask substrate, a second gear 25 having its axis coincident with the rotating center of the mask substrate and a third gear 26 meshed with the first gear 24 are arranged, and the second gear 25 and the third gear 26 are connected by a belt 27. The position of the second gear 25 can be changed from the position indicated by 25a to the position indicated by 25b by the third gear 26 and the belt 27, so that a distance between the center of the first gear 24 and the center of the second gear 25 can be changed accordingly. In this arrangement, the distance between the revolving center and the rotating center can be set for convenience. In this case, the changeable distance can be increased by the belt 27 in comparison with the case represented in FIG. 15.

Figure 18:
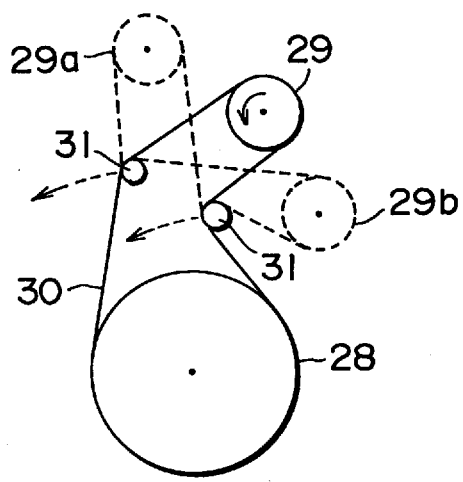
FIG. 18 is a view showing a fourth construction of the film-forming apparatus for the X-ray mask according to the second embodiment thereof.

Otherwise, as shown in FIG. 18, a first gear 28 having its axis coincident with the revolving center of the mask substrate, a second gear 29 having its axis coincident with the rotating center of the mask substrate, a belt 30 for connecting the first gear 28 and the second gear 29 and pulleys 31 for changing a direction of the belt 30 are arranged. The position of the second gear 29 can be changed from the position indicated by 29a to the position indicated by 29b by shifting the pulleys 31 in the arrow directions, so that a distance between the center of the first gear 28 and the center of the second gear 29 can be changed accordingly. In this arrangement, the distance between the revolving center and the rotating center can be set for convenience. In this case, the changeable distance can be increased by the belt 30 in comparison with the case represented in FIG. 15.

<Third Embodiment>

Figure 19A:
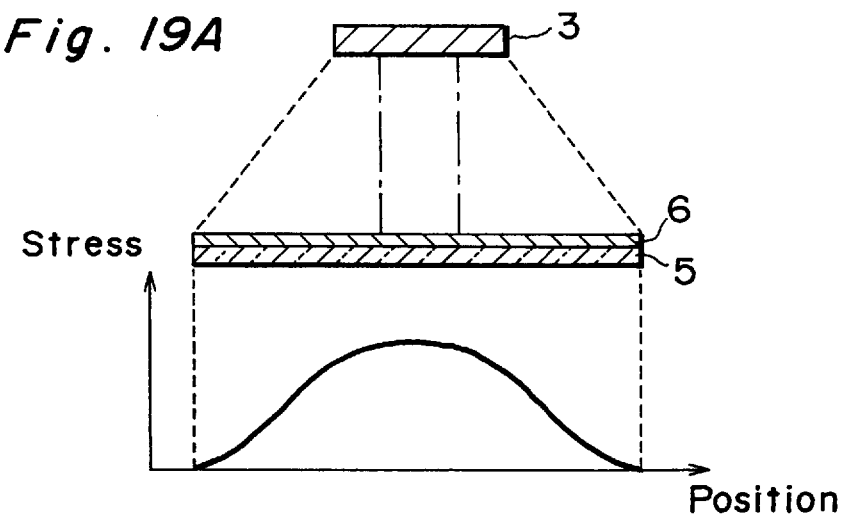
FIG. 19A is a view showing a relation between the arranging position of the mask substrate and the stress distribution according to the first embodiment of the present invention.

In the above-described embodiments, as shown in FIG. 19A, a surface of the target and a surface of the mask substrate are set in parallel. But, they are not limited to this. In a third embodiment, they can be set in an inclined manner, for example as shown in FIGS. 19B and 19C.

In case that the surface of the target and the substrate of the mask substrate are set in parallel as shown in FIG. 19A, when the X-ray absorber is formed similarly to the above-described embodiments, the stress distribution takes a gently-sloping mountain-shape which is symmetrical with respect to its center. But, when the dummy X-ray absorber 6a is formed on the dummy mask substrate 5 under the condition that the surface $1_1$ of the target 32 and the surface of the mask substrate are set to an inclined manner, for example at an angle of 1 degree from their parallel relationship as shown in FIG. 19B, it can be understood that a region of the good linear characteristic is extended in comparison with that represented in FIG. 19A in spite of asymmetry of the stress distribution.

Figure 19B:
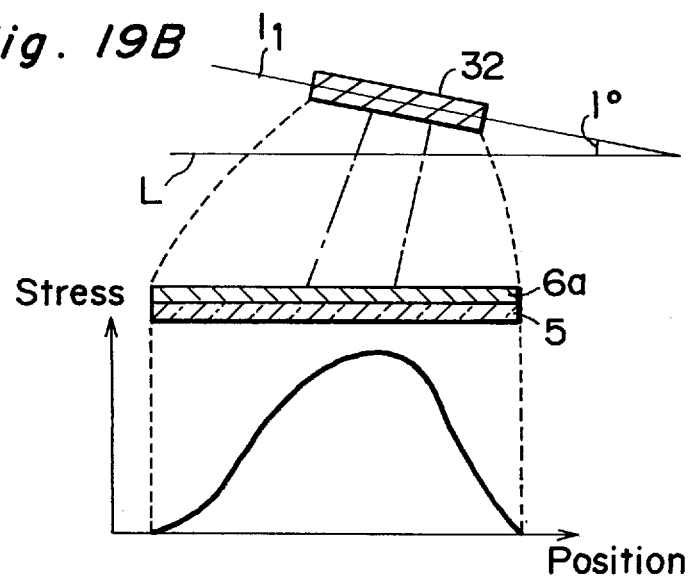
FIGS. 19B and 19C are views showing relations between the arranging position of the mask substrate and the stress distribution according to a third embodiment of the present invention.
Figure 19C:
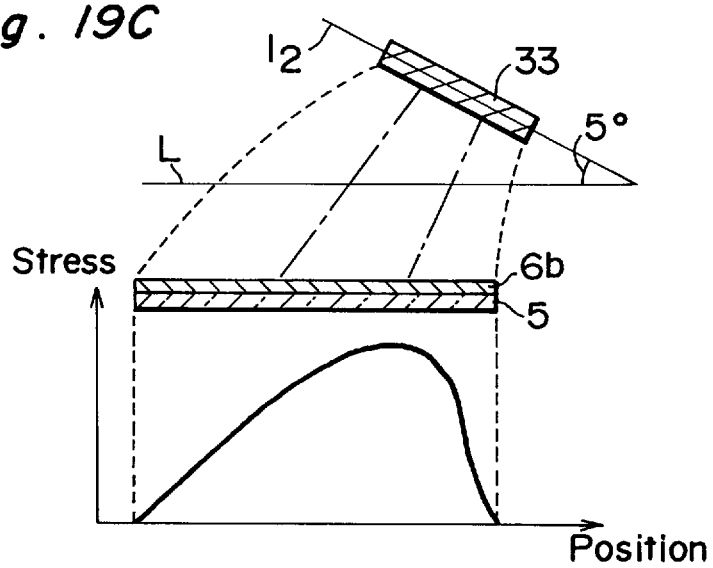

Further, as shown in FIG. 19C, when the dummy X-ray absorber 6 is formed on the dummy mask substrate 5 under the condition that the surface 12 of the target 33 and the surface of the mask substrate are set to an inclined manner, for example at an angle of 5 degrees from their parallel relationship, it can be understood that a region of the good linear characteristic is further extended in comparison with that represented in FIG. 19B.

In this way, while the surface of the target and the surface of the mask substrate are set in a positional relationship inclined at a predetermined angle to find out such a positional relationship as to increase the region having a good linear characteristic in the stress distribution for setting the desirable stress distribution range from this stress distribution similarly to the above-described embodiments, it is enough to form the X-ray absorber on the mask substrate similarly to the above-described embodiments with the positional relationship between the target and the mask substrate held in the above-mentioned relationship.

Incidentally, though herein provided was such an example that the target was inclined, the example is not limited to this, but of course, the mask substrate may be inclined.

Figure 20:
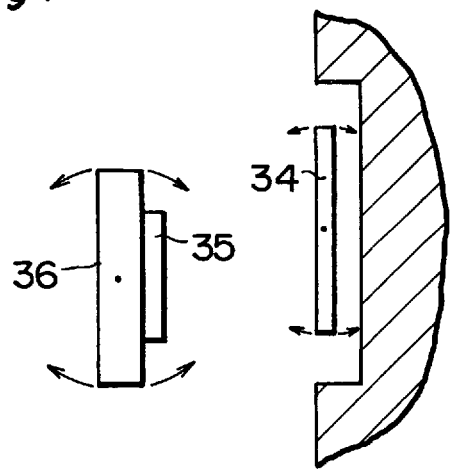
FIG. 20 is a view showing a first construction of a film-forming apparatus for the X-ray mask according to the third embodiment thereof.

In order to set the surface of the target and the surface of the mask substrate to a positional relationship inclined at the predetermined angle as mentioned above, it is necessary to provide such a mechanism as show in FIGS. 20 to 23 for the film-forming apparatus for the X-ray mask. First, as shown in FIG. 20, the film-forming apparatus for the X-ray mask can be provided with such a mechanism as to be capable of inclining a target 3 and a substrate holder 36 on which a mask substrate 35 is placed in the arrow directions.

Figure 21:
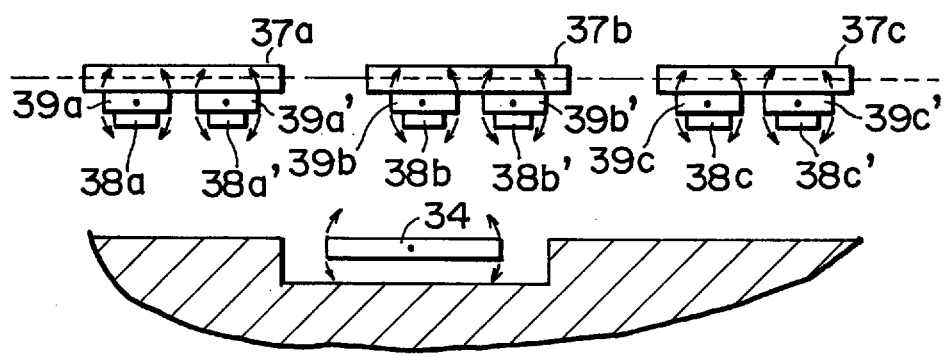
FIG. 21 is a view showing a second construction of the film-forming apparatus for the X-ray mask according to the third embodiment thereof.

As shown in FIG. 21, substrate holders 39a, 39a', 39b, 39b', 39c, 39c' on which mask substrates 38a, 38a', 38b, 38b', 38c, 38c' are placed respectively are placed on a plurality of carriers 37a, 37b, 37c.

In the case of a film-forming method for the X-ray mask adapted to sequentially form the X-ray absorbers, similarly to the case represented in FIG. 20, can be provided such a mechanism capable of inclining the substrate holders 39a, 39a', 39b, 39b', 39c, 39c' on which the mask substrates 38a, 38a', 38b, 38b', 38c, 38c' are placed.

Figure 22:
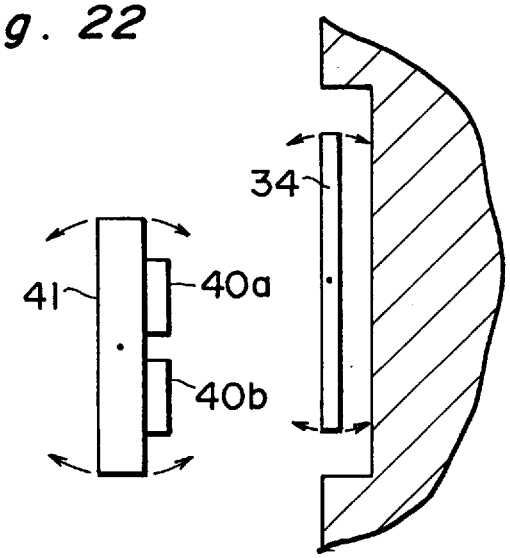
FIG. 22 is a view showing a third construction of the film-forming apparatus for the X-ray mask according to the third embodiment thereof.

Then, a film-forming apparatus for the X-ray mask as shown in FIG. 22 can be provided with such a mechanism capable of inclining a revolving pallet 41 on which mask substrates 40a, 40b are placed in the arrow directions.

Figure 23:
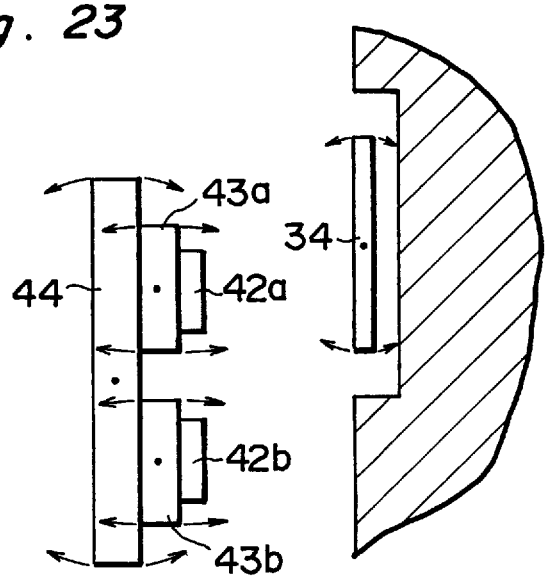
FIG. 23 is a view showing a fourth construction of the film-forming apparatus for the X-ray mask according to the third embodiment thereof.

Further, a film-forming apparatus for the X-ray mask as shown in FIG. 23 can be provided with such a mechanism capable of inclining rotating pallets 43a, 43b on which mask substrates 42a, 42b are placed respectively and also inclining a revolving pallet 44 on which the rotating pallets 43a, 43b are placed, in the arrow directions.

<Fourth Embodiment>

In the above-described respective embodiments, the mask substrate was rotated at the center of the desirable stress distribution range held at a certain position, other examples will be explained hereinafter.

Figure 24:
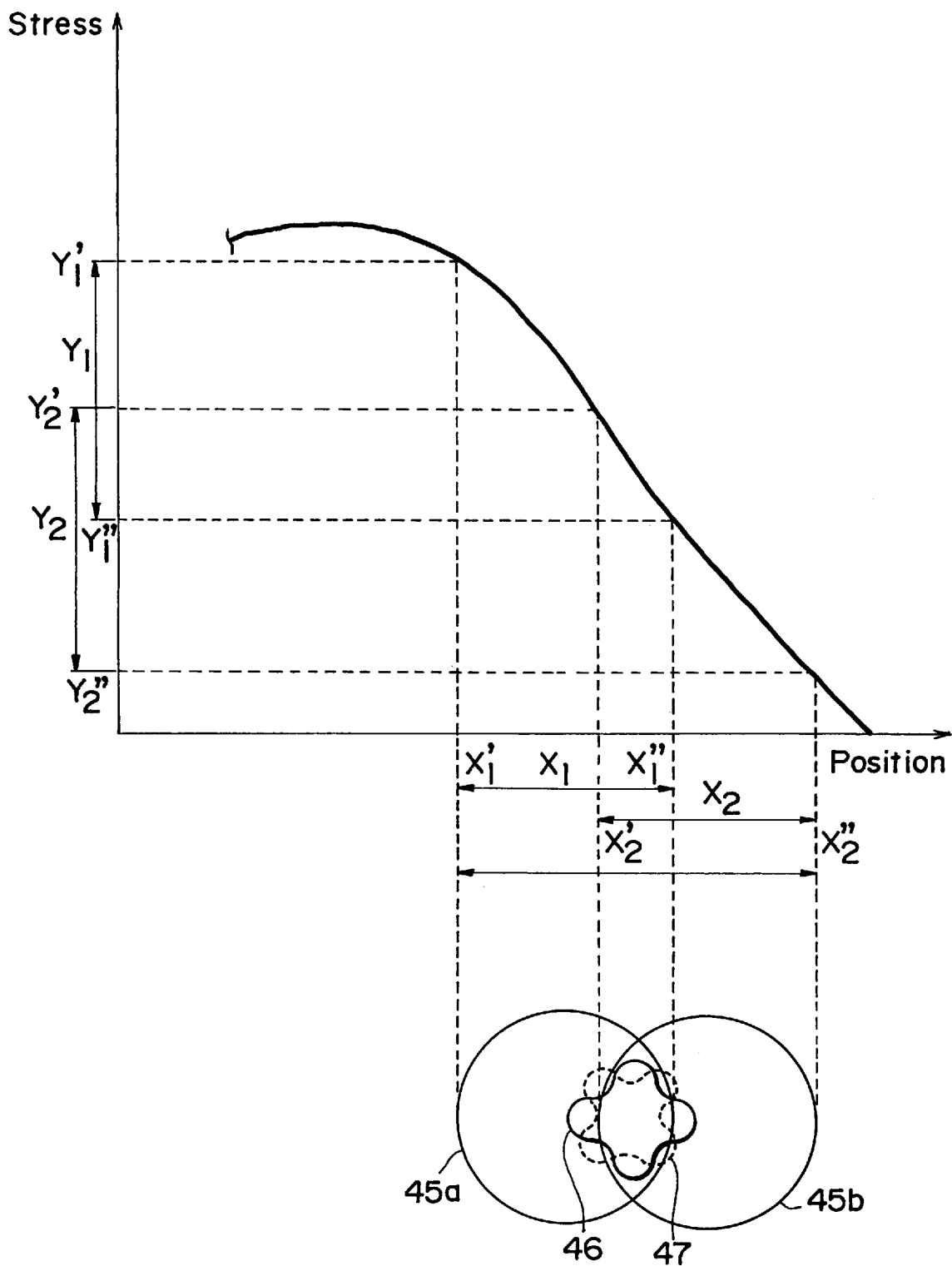
FIG. 24 is a view showing a film-forming method for a X-ray mask according to a fourth embodiment of the present invention.

In FIG. 24, the desirable stress distribution range X is set similarly to the above-described respective embodiments. Then, mask substrates 45a, 45b having diametral dimensions smaller than that of the desirable stress distribution range X are used and the X-ray absorbers are produced on the mask substrates 45a, 45b by means of film-forming while revolving and rotating the mask substrates within this desirable stress distribution range X. Thereupon, an orbit 46 of the revolving centers of the mask substrates 45a, 45b is offset from a circular orbit having its center coincident with the revolving center of the mask substrates. Since the orbit of the rotating centers of the mask substrates 45a, 45b is set to the orbit 46 as mentioned above, the X-ray absorbers are formed while passing along respective positions of the mask substrates 45a, 45b as illustrated. Therefore, for example, stress values of the mask substrates 45a, 45b at their outer peripheral portion are defined by a value of (y1'+y1"+y2'+ y2")/4 obtained by averaging stress values y1', y1" generated at the positions of the mask substrate 45a and stress values y2', y2" generated at the positions of the mask substrate 45b. Therefore, it becomes possible to obtain the X-ray mask having more uniform stress values in comparison with those in the above-described respective embodiments. Even if the desirable stress distribution range X is set wider than those in the above-described respective embodiments, it becomes possible to obtain the same degree of accuracy as those of the above-described respective embodiments.

The above example shows that the orbit 46 of the rotating centers of the mask substrates 45a, 45b was offset from the circular orbit having its center coincident with the revolving centers of the mask substrates. The present invention is not limited to this example. The uniform stress values can be obtained similarly even if this orbit is coincided with the circular orbit having its center coincident with the revolving centers of the mask substrates. However, since an area to be sputtered at the time of sputtering is three-dimensional, the mask substrates 45a, 45b also pass through a location out of the desirable stress distribution range X when carrying out the rotating and the revolving as mentioned above. Therefore, adoption of the orbit 46 illustrated in FIG. 24 can make the stress values averaged more surely.

Further, in order to average the stress values surely, for example a ratio of an off-centered period of the mask substrate to a revolving period of the mask substrate can be defined by a non-integer and also an orbit 47 different from the orbit 46 of the rotating centers of the mask substrates 45a, 45b can be selected.

A film-forming apparatus for the X-ray mask for performing along the orbit 46, 47 represented by the film-forming method for the X-ray mask in FIG. 24 will be explained hereinafter.

Figure 25:
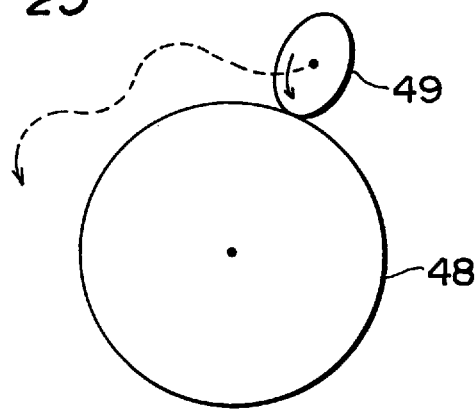
FIG. 25 is a view showing a first construction of a film-forming apparatus for the X-ray mask according to the fourth embodiment thereof.

First, as shown in FIG. 25, the apparatus comprises a first gear 48 having its axis coincident with the revolving center of the mask substrate and a second gear 49 having its axis coincident with the rotating center of the mask substrate. Thereupon, the first gear 48 is circularly formed and the second gear 49 is non-circularly formed. The second gear 49 is adapted to rotate along the circumference of the first gear 48 in the arrow direction so that the orbit of the second gear 49 can be varied like an arrow depicted by the dotted line. Therefore, the orbit 46 illustrated in FIG. 24 can be obtained.

Figure 26:
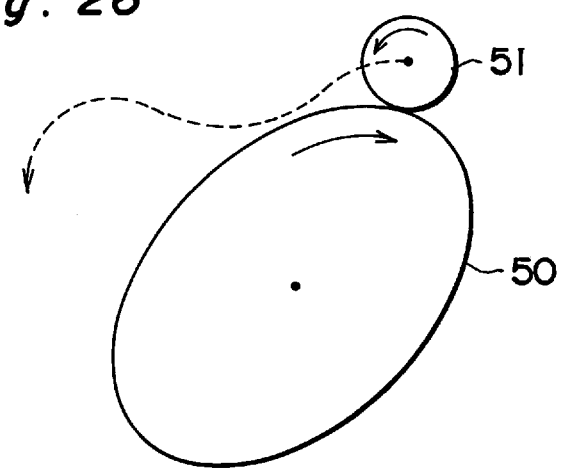
FIG. 26 is a view showing a second construction of the film-forming apparatus for the X-ray mask according to the fourth embodiment thereof.

Otherwise, as shown in FIG. 26, the apparatus comprises a first gear 50 having its axis coincident with the revolving center of the mask substrate and a second gear 51 having its axis coincident with the rotating center of the mask substrate. Thereupon, the first gear 50 is non-circularly formed and the second gear 51 is circularly formed. The second gear 51 is adapted to rotate along the circumference of the first gear 50 in the arrow direction so that the orbit of the second gear 51 can be varied like an arrow depicted by the dotted line. Therefore, the orbit 46 illustrated in FIG. 24 can be obtained.

Figure 27:
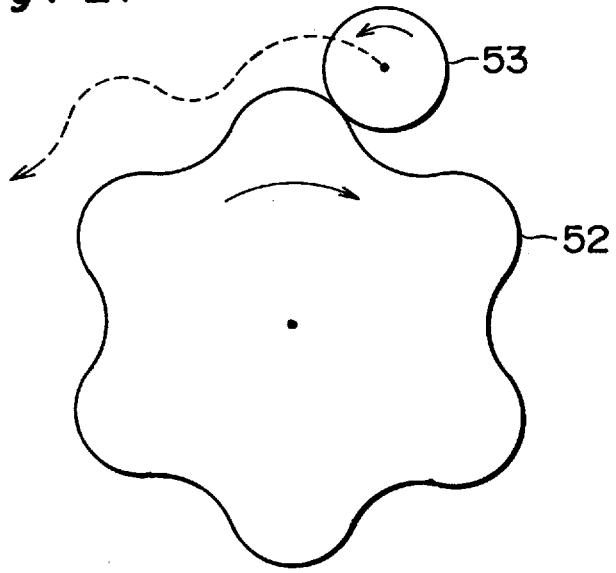
FIG. 27 is a view showing a third construction of the film-forming apparatus for the X-ray mask according to the fourth embodiment thereof.

Otherwise, as shown in FIG. 27, the apparatus comprises a first gear 52 having its axis coincident with the revolving center of the mask substrate and a second gear 53 having its axis coincident with the rotating center of the mask substrate. Thereupon, the first gear 52 is non-circularly formed like a flower-pattern and the second gear 53 is circularly formed. The second gear 53 is adapted to rotate along the circumference of the first gear 52 in the arrow direction so that the orbit of the second gear 51 can be varied like an arrow depicted by the dotted line. Therefore, the orbit 46 illustrated in FIG. 24 can be obtained.

Figure 28:
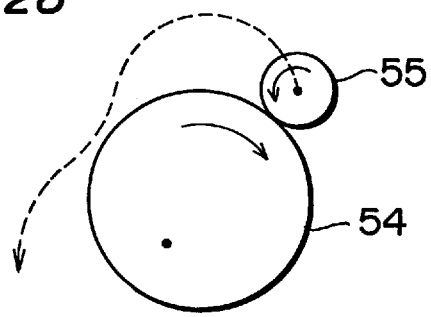
FIG. 28 is a view showing a fourth construction of the film-forming apparatus for the X-ray mask according to the fourth embodiment thereof.

Otherwise, as shown in FIG. 28, the apparatus comprises a first gear 54 having its axis coincident with the revolving center of the mask substrate and a second gear 55 having its axis coincident with the rotating center of the mask substrate. Thereupon, while the first gear 54 and the second gear 51 are circularly formed respectively, the axis of the first gear 54 is offset from its actual center. The first gear 54 is adapted to rotate along the circumference of the second gear 55 in the arrow direction so that the orbit of the second gear 55 can be varied like an arrow depicted by the dotted line by rotating the first gear 54 in the arrow direction. Therefore, the orbit 46 illustrated in FIG. 24 can be obtained.

Thereupon, the orbit 46, 47 can be obtained readily by setting a ratio of the number of teeth of the first gear 48, 50, 52, 54 to the number of teeth of the second gear 49, 51, 53, 55 to a non-integer.

Though the fourth embodiment represented such an example that the mask substrate having a diametral dimension smaller than the desirable stress distribution range X was rotated and revolved within the desirable stress distribution range X, the example is not limited to this. For example, even in the case illustrated in FIG. 12, it is of course that the apparatus can be operated well by making the diametral dimension smaller than the desirable stress distribution range X and adding the new orbital revolving as represented by the fourth embodiment.

<Fifth Embodiment>

Figure 29:
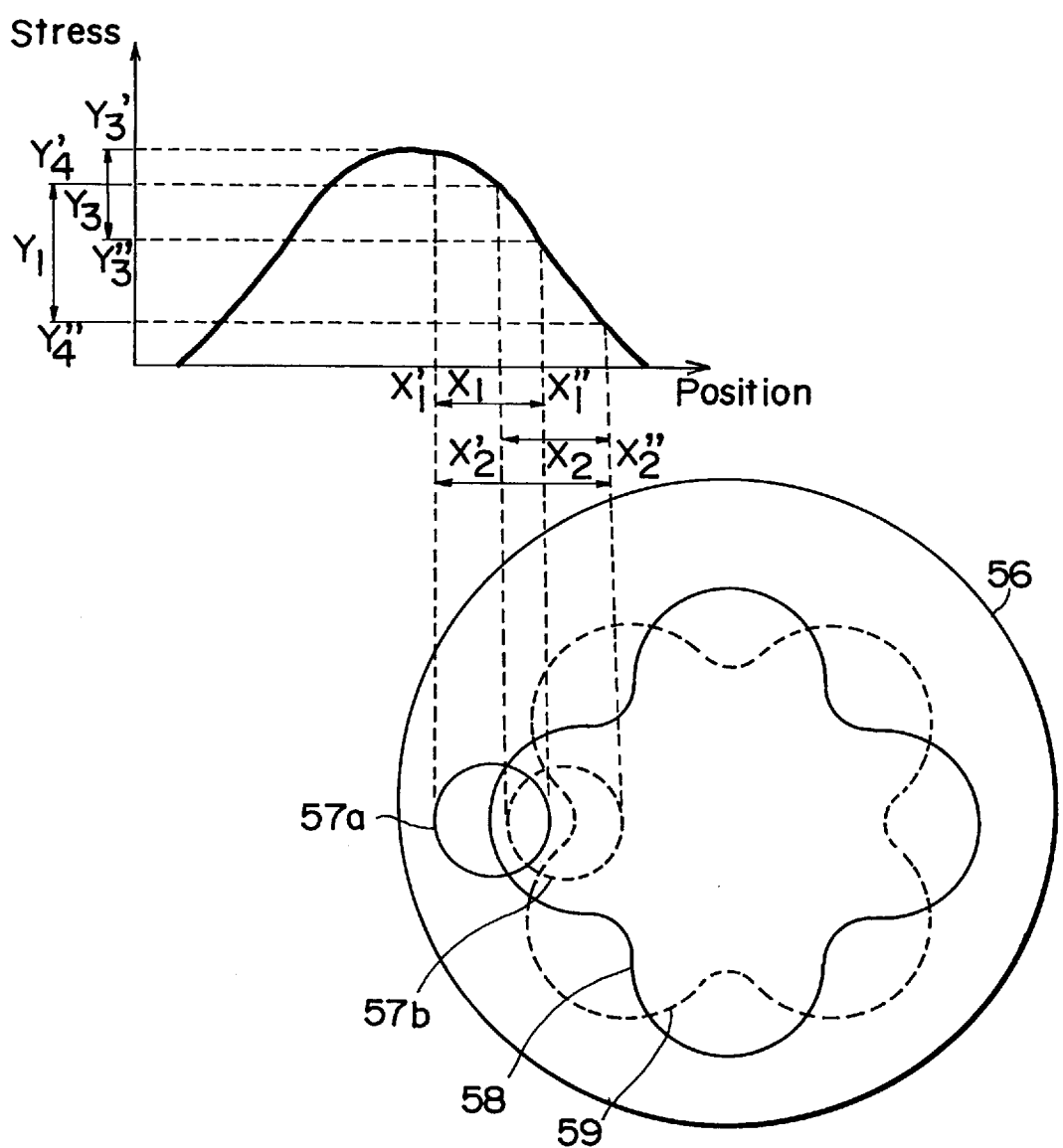
FIG. 29 is a view showing the film-forming method for the X-ray mask according to the fourth embodiment thereof.
Figure 32A:
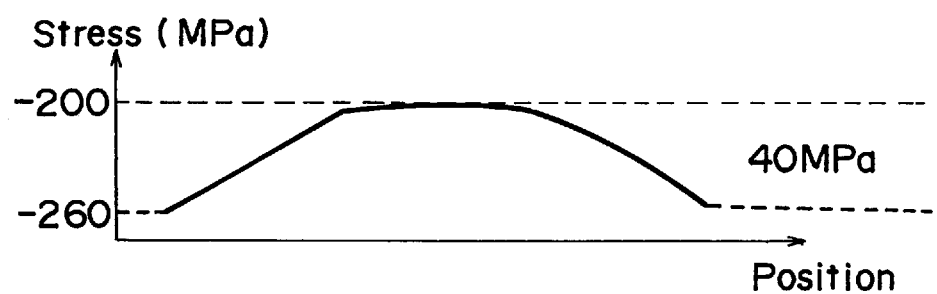
FIG. 32A is a graph showing a stress distribution obtained by the conventional film-forming method for the X-ray mask and FIG. 32B is a graph showing a temperature distribution obtained by the conventional film-forming method for the X-ray mask.
Figure 32B:
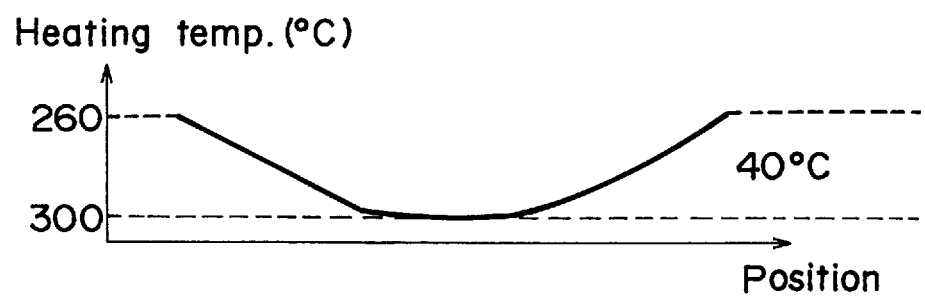

An off-centered orbit similar to the off-centered rotational orbit as represented by the fourth embodiment can be obtained based on the same consideration according to a method illustrated in FIG. 29.

First, the desirable stress distribution range X is set similarly to the above-described respective embodiments, and the X-ray absorber can be formed by orbitally revolving mask substrates 57a, 57b smaller than the desirable stress distribution range X so that passing regions of the mask substrates 57a, 57b are included within the desirable stress distribution range X and orbits 58, 59 of rotating centers of the mask substrates 57a, 57b are off-centered from the circular orbit having its center coincident with the revolving center of the mask substrate. Thereupon, a ratio of an off-centered period of the mask substrate to a revolving period of the mask substrate is defined by a non-integer, and the mask substrates 57a, 57b are adapted to also pass through the orbit 59 different from the orbit 58 of the rotating centers of the mask substrates 57a, 57b.

As mentioned above, since the orbits 58, 59 are employed as the rotating orbits of the mask substrates 57a, 57b, the X-ray absorbers can be formed passing through every position of the mask substrates 57a, 57b as illustrated in FIG. 29. Therefore, for example, a stress value of the mask substrate 57a, 57b at its outer peripheral portion becomes a value of (y3'+y3"+y4'+y4")/4 obtained by averaging stress values y3', y3" generated at the position of the mask substrate 57a and stress values y4', y4" generated at the position of the mask substrate 57b. Therefore, it becomes possible to obtain the X-ray mask having the stress values further averaged in comparison with those, in the above-described respective embodiments. Even if the desirable stress distribution range X is set wider than that represented by the above-described respective embodiments, it becomes possible to secure the same degree of accuracy as those in the above-described respective embodiments.

As represented by the fourth embodiment, since the sputtering area is three-dimensional, when the rotating and the revolving are performed as mentioned above, the mask substrates. 57a, 57b also pass through other portions besides the desirable stress distribution range X. Therefore, even when only the orbit 58 as shown in FIG. 29 is employed, it becomes possible to further promote the averaging of the stress values in the X-ray mask in comparison with the case of merely being rotated as represented by the second embodiment of FIG. 14. This film-forming apparatus for the X-ray mask can similarly utilize the one represented by the fourth embodiment.

Incidentally, though the above-described respective embodiment employed such a stress distribution in the dummy X-ray absorber that the compressive stress increases toward the mid portion of the absorber and then decreases toward the outer periphery thereof, such a stress distribution in the dummy X-ray absorber that a tensile stress increases and then decreases may be also employed depending on the sputtering technique. Even in this case, it is of course possible to carry out the above-described embodiments similarly.

What is claimed is:

1. A method of forming an X-ray absorber on an X-ray mask by sputtering a target onto a rotating mask substrate in a sputtering apparatus comprising the steps of:

determining a desirable stress distribution range within the sputtering apparatus, said desirable stress distribution range being relatively linear;

positioning said mask substrate so that a center of rotation thereof substantialy coincides with a center of the desirable stress distribution range;

and rotating said mask substrate while sputtering said target.

2. A method of forming an X-ray absorber on an X-ray mask according to claim 1, wherein said desirable stress distribution range is determined by the following steps:

sputtering said target onto a dummy mask substrate to form a dummy layer for measuring a stress distribution on said dummy mask substrate;

measuring said stress distribution of said formed dummy layer along a straight line passing over a surface of said dummy mask substrate; and selecting the desirable stress distribution range from a changing stress portion of the stress distribution.

3. A method of forming an X-ray absorber on an X-ray mask according to claim 2, wherein a surface of the target is inclined at a predetermined angle to a surface of the dummy mask substrate and a surface of the mask substrate.

4. A method of forming an X-ray absorber on an X-ray mask according to claim 2, wherein said dummy mask substrate is rotated at a center of a range where sputtering is applicable.

5. A method of forming an X-ray absorber on an X-ray mask according to claim 2, wherein the stress distribution is measured along a line passing through a center of rotation of the dummy mask substrate.

6. A method of forming an X-ray absorber on an X-ray mask according to claim 5, wherein said stress distribution is symmetrical with respect to a center line of said stress distribution and wherein said stress distribution decreases toward an outer periphery of said formed dummy layer so that two desirable stress distribution ranges are arranged at symmetrical positions with respect to the center line of said stress distribution; and wherein a center of revolution of the mask substrate coincides with the center line of said stress distribution; and wherein the mask substrate is rotated at the respective centers of the desirable distribution ranges.

7. A method of forming an X-ray absorber on an X-ray mask according to claim 2, wherein said stress distribution is determined in part by measuring the thickness of the dummy layer along the straight line passing over the surface of said dummy mask.

8. A method of forming an X-ray absorber on an X-ray mask according to claim 2, wherein said changing stress distribution is a decreasing compressive stress portion of the stress distribution which decreases toward an outer periphery of said dummy layer.

9. A method of forming an X-ray absorber on an X-ray mask according to claim 1, which further comprises a step of revolving said rotating mask substrate in a manner that a center of rotation of said mask substrate passes through a center of said desirable stress distribution range.

10. A method of forming an X-ray absorber on an X-ray mask according to claim 9, wherein said desirable stress distribution range is determined by the following steps:

sputtering said target onto a revolving dummy mask substrate to form a dummy layer on said dummy mask;

measuring a stress distribution of said formed dummy layer along a straight line passing over a surface of said dummy mask substrate; and selecting the desirable stress distribution range from a changing stress portion of the stress distribution.

11. A method of forming an X-ray absorber on an X-ray mask according to claim 9, wherein said mask substrate has a diameter which is smaller than a length X of said desirable stress distribution range.

12. A method of forming an X-ray absorber on an X-ray mask according to claim 9, wherein a center of rotation of said mask substrate revolves along an orbital path which is offset from a circular orbit having a same center as a center of revolution of said mask substrate.

13. A method of forming an X-ray absorber on an X-ray mask according to claim 12, wherein said sputtering apparatus is provided with a mechanism comprising a first gear having its axis coincident with the center of revolution of the mask substrate, and a second gear having its axis coincident with the center of rotation of the mask substrate, and wherein at least one of said first gear and said second gear being one selected from the group consisting of a non-circular gear and a gear with an eccentric axis.

14. A method of forming an X-ray absorber on an X-ray mask according to claim 13, wherein a ratio of a number of teeth of said first gear to a number of teeth of said second gear is a non-integer so that a ratio of an off-centered period of the mask substrate to a revolving period thereof is a non-integer.

15. A method of forming an X-ray absorber on an X-ray mask according to claim 9, wherein said mask substrate has a diameter which is smaller than a length of said desirable stress distribution range, and wherein an orbital path of the center of rotation of said mask substrate is eccentric from a circular orbital path having a same center as a center of the orbital path.

16. A method of forming an X-ray absorber on an X-ray mask according to claim 15, wherein a ratio of a cycle of said eccentric orbital path to a cycle of a revolution of said mask substrate is a non-integer.

17. A method of forming an X-ray absorber on an X-ray mask according to claim 9, wherein said sputtering apparatus is provided with a mechanism capable of changing a distance between the center of rotation of the mask substrate and a center of revolution of the mask substrate.

18. A method of forming an X-ray absorber on an X-ray mask according to claim 17, wherein said mechanism capable of changing a distance between the center of rotation of the mask substrate and the revolving center of the mask substrate comprises a first gear having its axis coincident with the center of revolution of the mask substrate, a second gear having its axis coincident with the center of rotation of the mask substrate, and at least one third gear interposed between said first gear and said second gear to change a distance between the axis of said first gear and the axis of said second gear.

19. A method of forming an X-ray absorber on an X-ray mask according to claim 17, wherein said mechanism capable of changing a distance between the center of rotation of the mask substrate and the center of revolution of the mask substrate comprises a first gear having its axis coincident with the center of revolution of the mask substrate, a second gear having its axis coincident with the center of rotation of the mask substrate, and a third gear engaging with said first gear and a belt for connecting said third gear and said second gear so that a distance between the axis of said first gear and the axis of said second gear can be changed through said third gear and said belt.

20. A method of forming an X-ray absorber on an X-ray mask according to claim 17, wherein said mechanism capable of changing a distance between the center of rotation of the mask substrate and the center of revolution of the mask substrate comprises a first gear having its axis coincident with the center of revolution of the mask substrate, and a second gear having its axis coincident with the center of rotation of the mask substrate, and at least one belt connecting said first gear and said second gear so that a distance between the axis of said first gear and the axis of said second gear can be changed by extending and contracting the belt.

21. A method of forming an X-ray absorber on an X-ray mask according to claim 17, wherein said sputtering apparatus is provided with a mechanism capable of setting a surface of the mask substrate and a surface of the target in a positional relationship so that said surfaces are not parallel to each other.

22. A method of forming an X-ray absorber on an X-ray mask according to claim 9, wherein said changing stress distribution is a decreasing compressive stress portion of the stress distribution which decreases toward an outer periphery of said dummy layer.

23. A method of forming an X-ray absorber on an X-ray mask according to claim 1, wherein stress deviations in the desirable stress distribution range with respect to a linear characteristic T obtained by a line joining a stress value at one end of the desirable stress distribution range and a stress value at the other end thereof are set to 50 MPa or less within the desirable stress distribution range.

24. A method of forming an X-ray absorber on an X-ray mask according to claim 1, wherein the desirable stress distribution range has an intersecting point between a stress distribution curve and a linear characteristic obtained by a line joining a stress value at one end of the desirable stress distribution range and a stress value at the other end thereof, and wherein stress deviations in the desirable stress distribution range with respect to the linear characteristic are set to 100 MPa or less.

25. A method of forming an X-ray absorber on an X-ray mask according to claim 1, wherein said sputtering apparatus is provided with a mechanism capable of changing a horizontal distance and a vertical distance between the rotating center of the mask substrate and a center of the target.

26. A method of forming an X-ray absorber on an X-ray mask by sputtering a target onto a rotating mask substrate in a sputtering apparatus comprising the steps of:
   determining a desirable stress distribution range within the sputtering apparatus;
   positioning said mask substrate so that a center of rotation thereof substantially coincides with a center of the desirable stress distribution range;
   and rotating said mask substrate while sputtering said target;
   said desirable stress distribution range being one which results in a lower maximum stress differential in said X-ray absorber when said mask substrate is rotated at the center of said desirable stress distribution range while sputtering said target.

* * * * *